TUNNEL DIODE CONVERTER UTILIZING TWO TUNNEL DIODES

Filed Dec. 7, 1960

INVENTOR.
David J. Carlson
BY
Eugene M. Whitacre
ATTORNEY

United States Patent Office 3,148,331

Patented Sept. 8, 1964

3,148,331

TUNNEL DIODE CONVERTER UTILIZING TWO TUNNEL DIODES

David J. Carlson, Haddon Heights, N.J., assignor to Radio Corporation of America, a corporation of Delaware Filed Dec. 7, 1960, Ser. No. 74,310

11 Claims. (Cl. 325—449)

This invention relates to signal translating systems including negative resistance devices for processing at least two signals of different frequency. More particularly, this invention relates to frequency converter circuits for converting signal modulated carrier waves to a correspondingly modulated carrier wave of different frequency.

It is an object of this invention to provide an improved signal translating system including negative resistance devices.

Another object of this invention is to provide an improved frequency converter circuit using negative resistance devices.

It is a further object of this invention to provide an improved diode frequency converter system which can provide a conversion gain of greater than unity.

A signal translating circuit in accordance with the invention includes a pair of negative resistance devices having similar operating characteristics over at least a portion of their dynamic ranges. The negative resistance diodes are connected in circuit to present one form of conductance characteristic to signals of a first frequency and a materially different form of conductance characteristic to signals of a second frequency. More particularly, the two diodes are biased for operation on a portion of their negative resistance characteristics. The diodes are coupled so that signal excursions of the first frequency causes the negative conductance of the two devices to increase or decrease together, but signal excursions of the second and different frequency causes the negative conductance of one of the devices to increase as the negative conductance of the other device decreases. It has been found that circuits, such as frequency converters, embodying the invention exhibit good performance characteristics, and in particular, an exceptionally good noise factor as compared with similar purpose prior circuits including negative resistance devices.

Accordingly, it is a still further object of this invention to provide an improved frequency converter, including a pair of negative resistance devices, which exhibits an improved noise factor.

The novel features that are considered to be characteristic of this invention are set forth with particularity in the appended claims. The invention itself, however, both as to its organization and method of operation as well as additional objects and advantages thereof will best be understood from the following description when read in connection with the accompanying drawing, in which:

FIGURE 1 comprising *a*, *b* and *c* is a series of graphs illustrating the current-voltage characteristic, resistance characteristic and conductance characteristic respectively of a voltage controlled negative resistance diode;

Although the circuits embodying the invention will be described as including a tunnel diode negative resistance device, other negative resistance devices satisfying the frequency and other circuit requirements may also be used.

Figure 1:
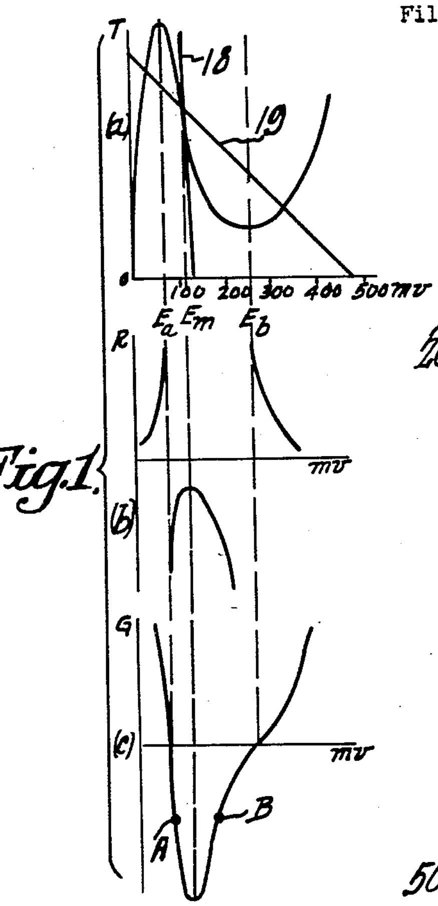

Tunnel diodes are a thin or abrupt junction semiconductor diodes having a free carrier concentration several orders of magnitude higher than that used in conventional diodes. Tunnel diodes have a forward biased current-voltage characteristic as shown in FIGURE 1, graph *a*. It will be noted that the characteristic possesses three distinct regions of interest. For applied voltages of relatively small values, in the region from zero to $E_a$, the current through the tunnel diode increases as the voltage applied across the tunnel diode increases. Thus, in this first region of relatively small applied voltage values, the tunnel diode exhibits a positive resistance. However, in the next succeeding region of applied voltage values from $E_a$ to $E_b$, a dip in the characteristic occurs. Over this intermediate region, the current through the diode decreases as the voltage applied across the diode increases. Thus, in this intermediate region, the tunnel diode exhibits a negative resistance. In the third region of applied voltage values, i.e. values above $E_b$, the current through the diode returns to a condition of increasing current with increasing values of voltage applied across the diode. Thus, in this third region, the diode again exhibits a positive resistance.

In FIGURE 1, graph *b*, the resistance variations of the diode with changes in the applied voltage are shown. In the zero to $E_a$ region, the positive character of the resistance may be noted, the positive resistance increasing with applied voltage and approaching infinity at $E_a$. In the intermediate $E_a$ to $E_b$ region, the negative character of the resistance is to be noted, the negative resistance approaching infinity at both $E_a$ and $E_b$ values, but decreasing through negative values therebetween to a minimum resistance value at an intermediate voltage value $E_m$. A comparison of FIGURE 1, graphs *b* and *a*, reveals that the voltage value $E_m$, at which minimum negative resistance is exhibited, corresponds to the value at which the negative slope of the current-voltage characteristic is a maximum (i.e. the point of inflection in the negative resistance exhibiting region of the device current-voltage operating characteristic). In the third region representing voltage values above $E_b$, the return to a positive character for the exhibited resistance is to be noted, the positive resistance decreasing with applied voltage from a value approaching infinity at $E_b$.

In FIGURE 1, graph *c*, the conductance variations of the tunnel diode with changes in the applied voltage are illustrated graphically. It will be noted that the conductance characteristic of FIGURE 1, graph *c* bears the expected reciprocal relationship to the resistance characteristic of FIGURE 1, graph *b*. In the zero to $E_a$ region, the conductance is positive, and decreases from a maximum to a value of zero at $E_a$. In the intermediate $E_a$ to $E_b$ region, the conductance is negative and increases through negative values from a zero value at $E_a$ to a maximum value $G_m$ at a voltage $E_m$, and then decreases through negative values thereafter to a zero value at $E_b$. In the third region, i.e. for voltage values above $E_b$ the conductance is again positive and increases from a zero value as the voltage is increased above $E_b$.

To bias the diode for stable operation in the negative resistance region of its characteristic requires a suitable voltage source having a smaller internal impedance than the absolute value of the negative resistance of the diode. Such a voltage source has a D.C. load line 18 as indicated in FIGURE 1, graph *a*, which is characterized by the current-voltage relationship which has a greater slope than the negative slope of the diode characteristic and intersects the diode characteristic at only a single point. If the voltage source has internal resistance which is greater than the negative resistance of the diode, this source would have a load line 19 which would have a smaller slope than the negative slope of the diode characteristic as indicated in FIGURE 1, graph *a*, and could intersect the diode characteristic curve at three points. Under the latter conditions, the diode is not stably biased in the negative resistance region. This lack of stability is because an incremental change in current through the diode due to transient noise currents, or the like, produces a regenerative reaction which causes the diode to assume one of its two stable stages represented by the intersection of the load line 19 with the positive resistance portion of the diode characteristic.

Figure 4:
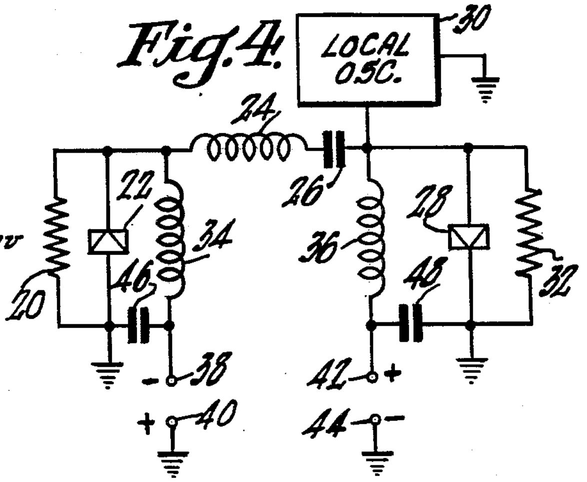
FIGURE 4 is a schematic circuit diagram of a frequency converter embodying the invention.

A schematic circuit diagram of a frequency converter circuit embodying the invention is shown in FIGURE 4. A source of signal modulated carrier waves at frequency $f_1$, not shown, but having an equivalent conductance represented by a resistor 20 is coupled to a tunnel diode 22. The tunnel diode 22 is coupled through a coupling circuit comprising an inductor 24 and a D.C. blocking capacitor 26 to a second tunnel diode 28. The coupling circuit is designed to shift the phase of the input signal so that signals of frequency $f_1$ applied to the diode 28 are 180° out of phase with those applied to the diode 22. In other words, the inductor 24 is selected to resonate with the capacitance of the diode 28 at a frequency below $f_1$, so that the voltage across the diode capacitance is 180° out of phase with voltage applied to the coupling network. A heterodyning wave from a local oscillator 30 is applied to the diode 28. If desired, the coupling circuit may be designed to cause the local oscillator signal appearing across the diodes 22 and 28 to be 180° out of phase, in the same manner as for signal modulated carrier waves. Alternatively, for balancing purposes, equal-in-phase voltages may be applied to both diodes by providing another connection, not shown, from the local oscillator 30 to the diode 22. In the latter case, sufficient isolation must be provided in the oscillator injection circuits to avoid shorting out the coupling circuit 24–26.

A utilization circuit, such as an intermediate frequency circuit for the resultant beat frequency signals at frequency $f_2$ which is lower than the frequency $f_1$, having an equivalent conductance represented by the resistor 32 is coupled across the tunnel diode 28. The circuit is designed so that the inductors 34 and 36, which complete the D.-C. path for the diodes 22 and 28 respectively, appear as high impedance elements at the incoming signal frequency $f_1$, but form a portion of the intermediate frequency circuit together with the inductor 24 and the capacitance of the diodes 22 and 28. The circuit elements primarily affecting signals at the frequency $f_1$ are the inductor 24 and the capacitance of the diodes 22 and 28.

Means providing a biasing voltage source for the tunnel diode 22 is connected between the terminals 38 and 40, and means providing a biasing voltage source for the tunnel diode 28 is connected between the terminals 42 and 44. A pair of capacitors 46 and 48 which have low impedance at signal and intermediate frequencies, are connected between the terminals 27 and 29, respectively, and ground.

Both of the diodes 22 and 28 are biased for stable operation in the negative resistance region of their operating characteristic by their respective biasing voltage sources. As mentioned above, for stable biasing in the negative resistance region, the effective D.-C. resistance of the biasing source, including all D.-C. paths in shunt with the tunnel diode must be less than that of the absolute value of the negative resistance exhibited by the diode. For stable operation, the total shunt positive A.-C. conductance of the circuit which is primarily due to the equivalent conductances of the signal source and utilization circuit must exceed the total negative conductances of the diodes 22 and 24.

In accordance with the invention, both of the tunnel diodes 22 and 28 are biased at point A or at point B, as shown in FIGURE 1*c*. In this regard, it is noted that the biasing points A and B are located approximately, although not necessarily, at the midpoint between zero and the maximum negative conductance.

Considering the operation of the circuit, it will be noted that the anode of the diode 22 and the cathode of the diode 28 are grounded. The applied signal modulated carrier waves of frequency $f_1$ which are developed across the diode 28 are 180° out of phase with the signals developed across the diode 22. As this wave swings positive, the forward bias on both diodes is reduced, and as the wave swings negative, the forward bias on both diodes increases. Thus, for signals of frequency $f_1$, the conductance of both diodes increases and decreases at the same time. Accordingly, the diodes 22 and 28 may be considered as a single diode having a composite conductance characteristic of the general form shown in FIGURE 1*c*.

Figures 2, 3:
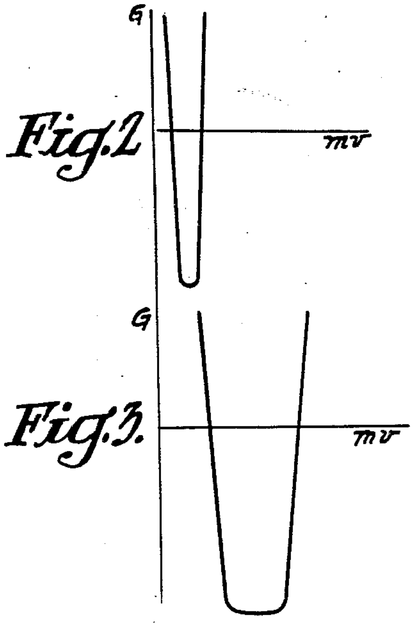
FIGURES 2 and 3 illustrate graphically certain composite conductance characteristics of a pair of negative resistance devices connected as shown in FIGURES 4 and 5.

For signals of the intermediate frequency, i.e. frequency $f_2$, the same phase of signals appears on both diodes. In other words, the series circuit comprising the inductor 24 and one or the other of the diode capacitances is resonant at a frequency below $f_1$ but above the intermediate frequency $f_2$. Thus, as the intermediate frequency wave swings positively with respect to circuit ground, the forward bias on the diode 22 is decreased, and the forward bias on the diode 28 is increased. Assuming that both diodes are biased at point A, it will be seen from FIGURE 1*c* that the signal voltage swing in the positive direction increases the negative conductance of the diode 28 and reduces the negative conductance of the diode 22. With the signal voltage swinging negative, the changes in the conductance of the diodes is reversed, that is the conductance of the diode 22 increases and the conductance of the diode 28 decreases. The change in conductance in the two diodes being in opposite directions for signal voltage swings of frequency $f_2$, tends to minimize conductance variation with signal voltage swing, thereby expanding the dynamic range over which signals of frequency $f_2$ may be linearly amplified. The composite conductance characteristic that the diodes 22 and 28 exhibit to signals of frequency $f_2$ is shown in FIGURE 2. It will be noted that there is a marked difference between the negative resistance characteristics exhibited to signal of frequency $f_1$ as opposed to those of frequency $f_2$, as shown in FIGURES 1*c* and 2 respectively.

With both diodes biased at point B the situation is essentially the same for signals of frequency $f_1$ but slightly different for signals at frequency $f_2$ in that the composite negative conductance characteristic exhibited at the two diodes is as shown in FIGURE 3.

Converter circuits of the type described in connection with FIGURE 4 were found to exhibit excellent performance characteristics and, in particular, to have good noise factors as compared to other types of converter circuits employing negative resistance devices. It is thought that one reason for the improved operation of this circuit is that the conductance characteristic presented to applied signals of frequency $f_1$ is non-linear in that the conductance varies with signal swing, and thus aids in the development of the beat frequency sidebands which result in the intermediate frequency. On the other hand, for intermediate frequency signals at frequency $f_2$, the conductance characteristic is more linear providing a substantially linear amplification of the resulting intermediate frequency signal, and some degree of isolation from the applied carrier wave and oscillator signals.

Figure 5:
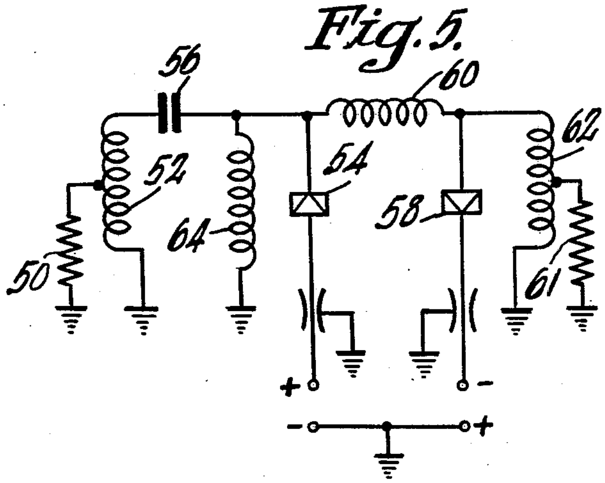
FIGURE 5 is a schematic circuit diagram of a self-oscillating frequency converter embodying the invention.

Reference is now made to the self-oscillating converter schematic circuit diagram of FIGURE 5. An applied radio frequency carrier wave of frequency $f_1$ from a source, not shown, but having an equivalent resistance represented by the resistor 50, is applied to a radio frequency input winding 52. The radio frequency carrier wave source is tapped down on the winding 52 for impedance matching purposes. The radio frequency input winding 52 is coupled to a tunnel diode 54 through a decoupling capacitor 56, and further to the tunnel diode 58 through a phase inversion circuit including an inductor 60. The decoupling capacitor 56 reduces interaction problems between the radio frequency carrier wave source and the converter circuit.

The intermediate frequency output circuit for deriving the converted intermediate frequency signal is represented by its equivalent resistance 61 which is tapped down on the output winding 62 for impedance matching purposes. The biasing circuits for the diodes which includes the output winding 62 and the winding 64 is similar to the circuit described in connection with FIGURE 4.

The operation of the circuit of FIGURE 5 is similar to that of FIGURE 4 in that the incoming signal modulated carrier waves are applied to the diodes 54 and 58 in opposite phase so that the conductance of the diodes 54 and 58 increases and decreases together to give a composite conductance characteristic of the general form shown in FIGURE 1*c*. In addition, intermediate frequency signals are developed in the same phase across the diodes so that the diodes present a composite conductance characteristic of the type shown in FIGURES 2 and 3 depending on whether the diodes are biased at point A or B, respectively.

The main difference in operation between the circuits of FIGURES 4 and 5 is that local oscillation waves for heterodyning the applied signal modulated carrier waves to the intermediate frequency are generated in the converter circuit itself, and no external oscillator is required. The oscillator portion of the circuit essentially comprises the coupling inductor 60 and the capacitances of the diodes 54 and 58, together with the effective negative conductance of these diodes. The relative values of the inductance of the inductor 60 and capacitances of the diodes 54 and 58 is selected to resonate at a desired frequency of oscillation. The circuit parameters are selected so that the negative conductance of the diodes 54 and 58 is less than the positive conductance of either the R-F input circuit represented by the resistor 50 or the I-F output circuit represented by the resistor 61, so that the converter is stable at the R-F input and at the I-F output frequencies. However, the positive conductance of the resonant elements of the oscillator portion of the circuit is less than the composite negative conductance exhibited by the diodes 54 and 58 so that the circuit oscillates at the desired frequency.

The applied signal modulated R-F carrier wave and the internally generated local oscillation signal interact in the effective non-linear conductance of the two diodes (represented in FIGURE 1*c*) to produce a beat frequency or I-F signal which is developed across the I-F output circuit represented by the resistor 60. In both the circuits of FIGURES 4 and 5, the negative resistance of the diodes causes power to be supplied to the circuit thereby enabling the circuit to exhibit a conversion power gain as opposed to a power loss in the case of known types of passive diode converter circuits.

I claim:

1. An electrical circuit comprising first and second negative resistance devices, means for biasing said negative resistance devices to exhibit a negative resistance, circuit means coupled to said negative resistance devices for applying signals of a different first and second frequencies and means for coupling said first negatice resistance device to said second negative resistance device so that a signal wave of said first frequency causes said devices to exhibit a substantially different composite conductance characteristic from the composite conductance characteristic exhibited to a signal wave of said second frequency.

2. An electrical circuit comprising a first and second negative resistance device, means for biasing said negative resistance devices to exhibit a negative resistance, means providing a source of signal wave of a first frequency, means for developing signal waves of a second and different frequency and means for coupling said first and second negative resistance devices to said source so that said signal wave of said first frequency is developed across said devices in phase opposition but a signal wave of said second and different frequency is developed across said devices in phase.

3. An electrical circuit comprising a first and second negative resistance device, means for biasing said negative resistance devices to exhibit a negative resistance, input circuit means for coupling input signal waves of different first and second frequencies to said negative resistance devices, and means for coupling said first negative resistance device to said second negative resistance device so that a signal wave of said first frequency is developed across said devices in phase opposition, and a signal wave of said second and different frequency is developed across said devices in phase.

4. A frequency converter circuit for converting a signal modulated carrier wave of a first frequency to a correspondingly modulated intermediate frequency wave of a second frequency comprising a first and second negative resistance device, means for biasing said negative resistance devices to exhibit a negative resistance, means providing a source of signal modulated carrier waves of said first frequency, means for coupling said first negative resistance device to said source means for developing signal waves of a third frequency in said frequency converter circuit, an intermediate frequency output circuit coupled to said second negative resistance device, and inductive circuit means coupling said first and second resistance devices.

5. A frequency converter as defined in claim 4 wherein said inductive circuit means comprises an inductor which is series resonant with the interelectrode capacitance of one of said devices at a frequency between the frequency of said carrier wave and said intermediate frequency.

6. A signal translating circuit comprising first and second negative resistance devices having similar current-voltage characteristics over at least a portion of their dynamic ranges, means for biasing said devices to like points on their characteristics in the negative resistance region thereof, a signal input circuit for signals of a first frequency coupled to the first negative resistance device, a pair of terminals coupled to one of said devices for signals of a second frequency which is different from that of said first frequency, and means providing a circuit coupling the second negative resistance device to said signal input circuit to shift the phase of signals developed across said second device at said first frequency 180° with respect to the signals developed across said first device, and provide substantially the same phase of signals of said second frequency across both of said devices, said devices being poled so that like changes in voltage at the high signal potential terminal thereof cause the conductance of one diode to increase, and the conductance of the other diode to decrease.

7. A signal translating circuit comprising first and second negative resistance devices having similar current-voltage characteristics over at least a portion of their dynamic ranges, means for biasing said devices to points on their characteristics in the negative resistance region thereof, a signal input circuit for signals of a first frequency, a pair of terminals coupled to one of said devices for signals of a second frequency which is different from that of said first frequency, and means for coupling said first and second negative resistance devices to said signal input circuit so that excursions of signals of said first frequency cause the conductance of said devices to change in the same direction and excursions of signals of said second frequency cause the conductance of said devices to change in opposite directions.

8. A frequency converter circuit for converting a signal modulated carrier wave to an intermediate frequency comprising first and second negative resistance diodes each having an anode and a cathode and having similar current-voltage characteristics over at least a portion of their dynamic ranges, means for biasing said diodes to like points on their characteristics in the negative resistance region thereof, a signal input circuit for signals of a first frequency coupled to the first negative resistance diode, an intermediate frequency output circuit coupled to the second diode, means providing a source of heterodyne oscillation signals for combining with said carrier wave in said converter circuit to produce said intermediate frequency, an inductor coupling the cathode of one of said diodes to the anode of the other of said diodes, said inductor series resonant with the anode cathode capacitance of either of said diodes at a frequency between said intermediate frequency and said carrier wave frequency so that the phase of the carrier wave signals across said second diode is shifted 180° with respect to that across said first diode, and the phase of intermediate frequency signals across said diodes is substantially the same.

9. A self oscillating converter circuit including a pair of negative resistance devices, a carrier wave input circuit coupled to one of said devices, an intermediate frequency output circuit coupled to the other of said devices, and an inductor coupling said devices, the alternating current conductance of said input circuit or said output circuit at the carrier wave and intermediate frequencies respectively being greater than the composite negative inductance of said diode at the carrier and intermediate frequencies respectively, and the alternating current conductance of the circuit inducting said inductor and the interelectrode capacitance of said devices being less than the composite conductance of said diode at the desired frequency of oscillation.

10. An electrical circuit comprising in combination first and second nonlinear negative conductance devices, means for biasing said devices so that each exhibits a negative conductance, means coupled to said first and second devices for applying input signals of a first and second frequencies and means for coupling said first negative conductance device to said second negative conductance device so that excursions of signal waves of a first frequency cause the conductances of said devices to change in the same direction and excursions of signal waves of a second frequency cause the conductances of said devices to change in opposite directions.

11. In combination, first and second negative resistance devices, each having a non-linear negative conductance versus applied voltage characteristic, means for biasing each of said negative resistance devices to exhibit a negative resistance, signal input circuit means for coupling input signals to one of said negative resistance devices, and means coupled to said negative resistance devices including a frequency responsive circuit means connected between said first and second negative resistance devices to provide (1) a phase shift between the input signals applied to one of said negative resistance devices with respect to the input signals applied to the other one of said negative resistance devices when said input signals are of a first frequency, and (2) substantially no phase shift between said input signals when said input signals are of a second frequency, whereby said first and second negative resistance devices exhibit (1) a first negative conductance versus applied voltage composite characteristic when the signal voltages applied to each of said negative resistance devices are in phase with each other, and (2) a different second negative conductance versus applied voltage composite characteristic when said signal voltages applied to said negative resistance devices are out of phase with each other.

References Cited in the file of this patent

UNITED STATES PATENTS

| | | |
|---|---|---|
| 2,608,650 | Myers | Aug. 26, 1952 |
| 2,958,046 | Watters | Oct. 25, 1960 |
| 2,978,576 | Watters | Apr. 4, 1961 |

OTHER REFERENCES

Sommers: "Tunnel Diodes as High-Frequency Devices," Proceedings of the IRE, July 1939, pp. 1201–1206.

Chang et al.: "Low Noise Tunnel-Diode Down Converter Having a Conversion Gain," Proceedings of the IRE, May 1960, pp. 854–858.